United States Patent
Ge et al.

(10) Patent No.: US 10,461,887 B2
(45) Date of Patent: Oct. 29, 2019

(54) METHODS AND SYSTEMS FOR BLIND DETECTION WITH POLAR CODE

(71) Applicants: Yiqun Ge, Ottawa (CA); Wuxian Shi, Ottawa (CA)

(72) Inventors: Yiqun Ge, Ottawa (CA); Wuxian Shi, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/667,056

(22) Filed: Aug. 2, 2017

(65) Prior Publication Data

US 2018/0048418 A1  Feb. 15, 2018

Related U.S. Application Data

(60) Provisional application No. 62/372,872, filed on Aug. 10, 2016.

(51) Int. Cl.
| | |
|---|---|
| *H04L 1/00* | (2006.01) |
| *H04W 72/04* | (2009.01) |
| *H03M 13/13* | (2006.01) |
| *H03M 13/29* | (2006.01) |
| *H03M 13/09* | (2006.01) |

(52) U.S. Cl.
CPC .......... *H04L 1/0038* (2013.01); *H03M 13/13* (2013.01); *H03M 13/2906* (2013.01); *H04L 1/009* (2013.01); *H04L 1/0046* (2013.01); *H04W 72/0453* (2013.01); *H03M 13/09* (2013.01); *H04L 1/0054* (2013.01)

(58) Field of Classification Search
CPC ..... H04L 1/0038; H04L 1/0046; H04L 1/009; H04L 1/0054; H04W 72/0453
See application file for complete search history.

(56) References Cited

U.S. PATENT DOCUMENTS

| | | | | |
|---|---|---|---|---|
| 9,467,164 | B2 * | 10/2016 | Ionita | H04L 25/4917 |
| 2013/0117344 | A1 * | 5/2013 | Gross | G06F 17/10 |
| | | | | 708/490 |
| 2013/0283128 | A1 * | 10/2013 | Lee | G06F 11/1068 |
| | | | | 714/773 |
| 2014/0173376 | A1 | 6/2014 | Jeong et al. | |
| 2015/0055591 | A1 * | 2/2015 | Kang | H04L 5/0073 |
| | | | | 370/329 |

(Continued)

FOREIGN PATENT DOCUMENTS

| | | |
|---|---|---|
| CN | 104079370 A | 10/2014 |
| CN | 104683069 A | 6/2015 |

(Continued)

OTHER PUBLICATIONS

Huawei, HiSilicon: "Polar codes—encoding and decoding", 3GPP TSG RAN WG1 Meeting #xx Nanjing, China, May 23-27, 2016, R1-164039, May 27, 2016 , 7 pages.

(Continued)

*Primary Examiner* — Brandon J Miller

(57) ABSTRACT

Methods and systems for blind detection. At the encoder, a code word is encoded using a polar coder, where the input vector includes a user equipment (UE)-specific frozen sequence in the frozen bit positions. At the decoder, a set of short listed channel candidates is generated based on decoding using the UE-specific frozen sequence.

17 Claims, 10 Drawing Sheets

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

(100)

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

(102)

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

(104)

(56) References Cited

U.S. PATENT DOCUMENTS

2016/0013887 A1    1/2016  Shen et al.
2016/0164629 A1*   6/2016  Ahn ..................... H04L 1/0041
                                                                714/776
2018/0351579 A1*  12/2018  Hong ................... H03M 13/13

FOREIGN PATENT DOCUMENTS

CN          105680996 A     6/2016
WO          2018128928 A1   7/2018

OTHER PUBLICATIONS

Huawei, HiSilicon:"Overview of Polar Codes", 3GPP TSG RAN WG1 Meeting #84bis, R1-162161, Busan, Korea, Apr. 11-15, 2016. total 7 pages.

Coherent Logix Inc.:"UE_ID Insertion for Early Block Discrimination on DCI Blind Detection", 3GPP TSG RAN1-NR#2, R1-1711570, total 5 pages.

Coherent Logix Inc.:"Scrambling Sequence Design for Early Block Discrimination on DCI Blind Detection", 3GPP TSG RAN1-NR#2, R1-1711571, total 6 pages.

\* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

FIG. 1

METHODS AND SYSTEMS FOR BLIND DETECTION WITH POLAR CODE

CROSS-REFERENCE TO RELATED APPLICATIONS

The present disclosure claims priority from U.S. provisional patent application No. 62/372,872, the entirety of which is hereby incorporated by reference.

FIELD

The present disclosure relates to methods and systems for blind detection, in particular blind detection using polar code. The present disclosure may be used for blind detection of control channels.

BACKGROUND

A Long Term Evolution (LTE) user equipment (UE) generally uses blind detection to find its physical downlink control channel (PDCCH) channel allocation among the possible channel candidates (e.g., 44 possible channel candidates) allocated by a base station (BS). The PDCCH carries downlink control information (DCI) (e.g., including resource assignments) specific to a particular UE or group of UEs. Using blind detection, the UE is responsible for detecting whether it is the intended recipient of any DCI on all possible channel candidates. The probability of the UE failing to detect that it is the intended recipient of a PDCCH is referred to as the Missing Detection Probability ($P_{miss}$). The probability of the UE detecting that it is the intended recipient of the wrong PDCCH is referred to as the False Alarm Probability ($P_{FA}$). It is desirable to reduce both $P_{miss}$ and $P_{FA}$, however a false alarm may have greater negative impact because a false alarm can result in an erroneous uplink transmission and unexpected uplink interference.

Blind detection of PDCCH may be used in enhanced mobile broadband (eMBB) scenarios. Ultra-reliable low-latency communication (URLLC) may also require reliable blind detection. Blind detection may also be used in massive machine-type communications (mMTC). Each of these applications may benefit from greater reliability of blind detection.

SUMMARY

In some aspects, the present disclosure describes a method for encoding. A codeword intended for a recipient user equipment (UE) is generated using an encoder for a polar code. An input vector to the encoder includes a UE-specific frozen sequence in frozen bit positions and further includes data for transmission in information bit positions. The UE-specific frozen sequence is associated with the recipient UE. The codeword is transmitted.

In any of the preceding aspects/embodiments, the UE-specific frozen sequence may be based on a UE identifier (UEID) of the recipient UE.

In any of the preceding aspects/embodiments, the UE-specific frozen sequence may be generated by applying a function to the UEID.

In any of the preceding aspects/embodiments, the function may be a repeater function applied to the UEID.

In any of the preceding aspects/embodiments, the UEID may be a radio network temporary identifier (RNTI) or a group identifier.

In any of the preceding aspects/embodiments, the data for transmission may include control information.

In any of the preceding aspects/embodiments, the input vector may include an error-detection code appended to the data for transmission, and the error-detection code may be masked using a UEID.

In some aspects, the present disclosure describes a method for blind detection. A plurality of channel candidates is scanned. A set of short listed channel candidates is generated by: for each channel candidate: performing a first decoding of the channel candidate using a user equipment (UE)-specific frozen sequence; and discarding any channel candidate for which the first decoding fails to satisfy a first criterion.

In any of the preceding aspects/embodiments, the method for blind decoding may further include: for each short listed channel candidate, performing an error-detection code-assisted decoding of the short listed channel candidate. For a given short listed channel candidate that passes error checking during the error-detection code-assisted decoding, transmitted data is decoded from the given short listed channel candidate.

In any of the preceding aspects/embodiments, the UE-specific frozen sequence may be based on a UEID.

In any of the preceding aspects/embodiments, the UE-specific frozen sequence may include a repetition of the UEID.

In any of the preceding aspects/embodiments, the UEID may be a radio network temporary identifier (RNTI) or a group identifier.

In any of the preceding aspects/embodiments, generating the set of short listed candidates may include, for each channel candidate: performing a second decoding of the channel candidate using a reference frozen sequence; and determining whether the first decoding satisfies the first criterion by comparing the first and second decoding.

In any of the preceding aspects/embodiments, performing the comparing may include calculating a first path metric for the first decoding and a second path metric for the second decoding, and comparing the first and second path metrics.

In any of the preceding aspects/embodiments, the first criterion may include the first path metric being smaller than the second path metric.

In any of the preceding aspects/embodiments, generating the set of short listed candidates may include: calculating a ranking metric for the channel candidate; and including or excluding the channel candidate in the set of short listed candidates based on the ranking metric.

In any of the preceding aspects/embodiments, the ranking metric may be a normalization of a path metric obtained from the first decoding.

In any of the preceding aspects/embodiments, the first decoding may be performed using decoding without using an error-detection code.

In some examples, the present disclosure describes a polar encoder. The encoder includes a processor configured to cause the encoder to generate a codeword intended for a recipient user equipment (UE) using polar code encoding. An input vector to polar code encoding includes a UE-specific frozen sequence in frozen bit positions and further includes data for transmission in information bit positions. The UE-specific frozen sequence is associated with the recipient UE. The codeword is provided for transmission.

In any of the preceding aspects/embodiments, the UE-specific frozen sequence may be based on a UE identifier (UEID) of the recipient UE.

In any of the preceding aspects/embodiments, the processor may be further configured to cause the encoder to generate the UE-specific frozen sequence by repeating the UEID.

In any of the preceding aspects/embodiments, the UEID may be a radio network temporary identifier (RNTI) or a group identifier.

In any of the preceding aspects/embodiments, the data for transmission may include control information.

In any of the preceding aspects/embodiments, the input vector may include an error-detection code appended to the data for transmission, the error-detection code being masked using a UEID.

In some examples, the present disclosure describes a polar decoder. The decoder includes a processor configured to cause the decoder to scan a plurality of channel candidates. The decoder generates a set of short listed channel candidates by: for each channel candidate, performing a first decoding of the channel candidate using a user equipment (UE)-specific frozen sequence; and discarding any channel candidate for which the first decoding fails to satisfy a first criterion.

In any of the preceding aspects/embodiments, the decoder may further: for each short listed channel candidate, perform an error-detection code-assisted decoding of the short listed channel candidate. For a given short listed channel candidate that passes error checking during the error-detection code-assisted decoding, transmitted data is decoded from the given short listed channel candidate.

In any of the preceding aspects/embodiments, the UE-specific frozen sequence may be based on a UE identifier (UEID).

In any of the preceding aspects/embodiments, the UE-specific frozen sequence may include a repetition of the UEID.

In any of the preceding aspects/embodiments, the UEID may be a radio network temporary identifier (RNTI) or a group identifier.

In any of the preceding aspects/embodiments, the processor may be further configured to cause the decoder to generate the set of short listed candidates by: for each channel candidate: performing a second decoding of the channel candidate using a reference frozen sequence; and determining whether the first decoding satisfies the first criterion by comparing the first and second decoding.

In any of the preceding aspects/embodiments, the processor may be further configured to cause the decoder to perform the comparing by calculating a first path metric for the first decoding and a second path metric for the second decoding, and comparing the first and second path metrics.

In any of the preceding aspects/embodiments, the first criterion may include the first path metric being smaller than the second path metric.

In any of the preceding aspects/embodiments, the processor may be further configured to cause the decoder to generate the set of short listed candidates by further: calculating a ranking metric for the channel candidate; and including or excluding the channel candidate in the set of short listed candidates based on the ranking metric.

In any of the preceding aspects/embodiments, the ranking metric may be a normalization of a path metric obtained from the first decoding.

In any of the preceding aspects/embodiments, the first decoding may be performed using decoding without using an error-detection code.

BRIEF DESCRIPTION OF THE DRAWINGS

Reference will now be made, by way of example, to the accompanying drawings which show example embodiments of the present application, and in which:

FIG. 1 illustrates how a polar coding generator matrix may be produced from a kernel;

Similar reference numerals may have been used in different figures to denote similar components.

DESCRIPTION OF EXAMPLE EMBODIMENTS

Figure 2:
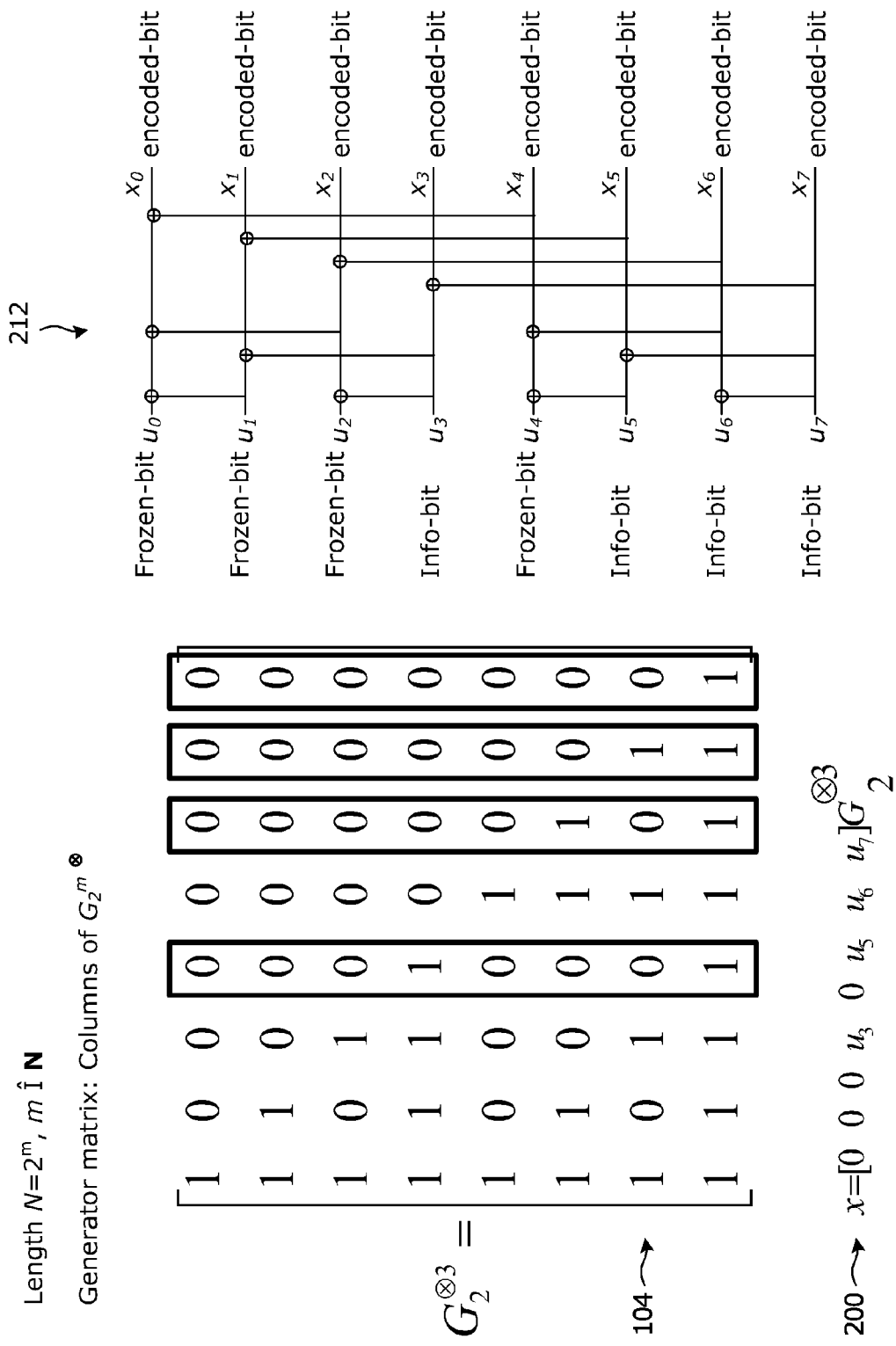
FIG. 2 illustrates an example use of a polar coding generator matrix for producing codewords, and an example polar encoder.

LTE proposes the use of tail-biting convolution code (TBCC) with an error-detection code, such as the use of cyclic redundancy check (CRC) bits, masked with a UE identifier, such as a radio network temporary identifier (RNTI). Conventionally, the UE performs multiple Viterbi decoding operations on the PDCCH candidates sequentially or in parallel and uses CRC to check each candidate. A successful CRC check indicates the candidate is a PDCCH intended for the UE. In the present disclosure, when the UE determines that it is the intended recipient of a channel (when a particular channel candidate passes decoding and CRC operations), this may be referred to as a successful detection of the channel, and the detected channel may be referred to as a successful candidate.

Polar codes have been proposed as channel codes for wireless communications. These codes have been found to be competitive with state-of-the-art error correction codes and have low encoding complexity. Polar codes are constructed with polarization of channels. A variety of decoders may be used for decoding polar codes. A successive cancellation (SC) decoder is a relatively simple decoder, with relatively high efficiency for hardware implementation, but may suffer from relatively low block error rate (BLER) performance. A list decoder is higher in complexity, and less efficient for hardware implementation, but provides higher BLER performance. However, a list decoder is typically limited by the maximum-likelihood (ML) boundary. A CRC-aided (CA) list decoder is similar to the list decoder, but has higher BLER performance than the ML boundary. The CA list decoder performs CRC on the survivor paths of a list decoder. If a survivor path passes CRC, that path is selected as the decoded outcome. If none of the survivor paths passes CRC, then the decoding is unsuccessful.

BLER performance is generally considered to be an important consideration for decoding of control channel information. Accordingly, the CA list decoder is of interest for decoding the control channel. However, the CA list decoder requires checking of the CRC bits for each candidate, over all survivor paths. When all survivor paths are considered over all candidates (e.g., all 44 candidates), this results in the CRC bits being used a very high number of times.

For a list polar decoder with 32 survivor paths per candidate, over 44 candidates, the CRC bits will be used 1,408 times. $P_{miss}$ and $P_{FA}$ values depend on how many times the CRC bits are used, with $P_{FA}$ increasing the more the CRC bits are used. In the example of 32 paths over 44 candidates, simulations show that $P_{FA}$ has a value above 0.01 and residual BLER has an even higher value, which may be unacceptably high, particularly for network communications requiring high reliability.

The present disclosure describes various examples of methods and systems to enable blind detection by the UE. The examples described herein help to reduce use of the CRC bits during channel detection. The examples described herein may be particularly useful for massive connection in 5G networks, where the number of candidates to be considered may be high.

To assist in understanding the present disclosure, the following discussion of polar coding is provided with reference to FIGS. 1 and 2. FIG. 1 is a diagram showing how a polar coding generator matrix can be produced from a kernel $G_2$ 100. The 2-fold Kronecker product matrix $G_2 \otimes^2$ 102 and the 3-fold Kronecker product matrix $G_2 \otimes^3$ 104 in FIG. 1 are examples of polar coding generator matrices. The generator matrix approach illustrated in FIG. 1 can be generalized to produce an m-fold Kronecker product matrix $G_2 \otimes^m$.

A polar code can be formed from a Kronecker product matrix based on the kernel $G_2$ 100. For a polar code having codewords of length $N=2^m$, the generator matrix is $G_2 \otimes^m$. FIG. 2 is a diagram showing an example use of a polar coding generator matrix for producing codewords and a schematic illustration of an example polar encoder. In FIG. 2, the generator matrix $G_2 \otimes^3$ 104 is used to produce codewords of length $2^3=8$. A codeword x is formed by the product of an input vector u=[0 0 0 $u_3$ 0 $u_5$ $u_6$ $u_7$] and the generator matrix $G_2 \otimes^3$ 104 as indicated at 200. The input vector u is composed of frozen bits and information bits. In the specific example shown in FIG. 2, $N=2^3=8$, so the input vector u is an 8-bit vector, and the codeword x is an 8-bit vector.

In polar code construction, the input vector carries information only in the information bits, which have predefined positions in the input vector. The remaining bits of the input vector do not carry information and are referred to as frozen bits. The positions of the frozen bits in the input vector are known to both the encoder and the decoder. Because the frozen bits do not carry information, in theory, the frozen bits can be set to any bit value so long as the location of the frozen bits is known to both the encoder and the decoder. Conventionally, the frozen bits are all set to zero.

In the example of FIG. 2, the input vector has frozen bits in positions 0, 1, 2 and 4, and has information bits in positions 3, 5, 6, and 7. It should be understood that the positions of the frozen bits (also referred to as the frozen positions) may be different, as long as the frozen positions are known to both the encoder and the decoder. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits.

As described above, the values of the frozen bits are conventionally set to be all zero. However, using non-zero bits in the frozen bits is not expected to change the BLER performance. In examples described herein, the frozen bits may contain non-zero values to assist in blind detection by the UE. The sequence of values (whether zero or non-zero) carried in the frozen bits may be referred to as a frozen sequence. In particular, the frozen bits may carry a UE-specific frozen sequence, to enable a UE to detect that it is the intended recipient of the codeword. The UE-specific frozen sequence should be associated with the intended UE and known to both the encoder (at the BS) and the decoder (at the UE). The UE-specific frozen sequence should be unique to the intended UE, for unicast transmission, or unique to the intended group of UEs, for multicast transmission. In examples described herein, a UE identifier (UEID), such as the RNTI or other identifying information, for example a group ID for a multicast communication, is used to generate a sequence of bits to be encoded in the frozen bits. The decoder at a recipient UE performs decoding in two stages. At the first stage, the decoder uses the UE-specific frozen sequence to generate a short list of channel candidates from all possible candidates. At the second stage, the decoder performs CA list decoding on the short list of candidates.

Figure 3:
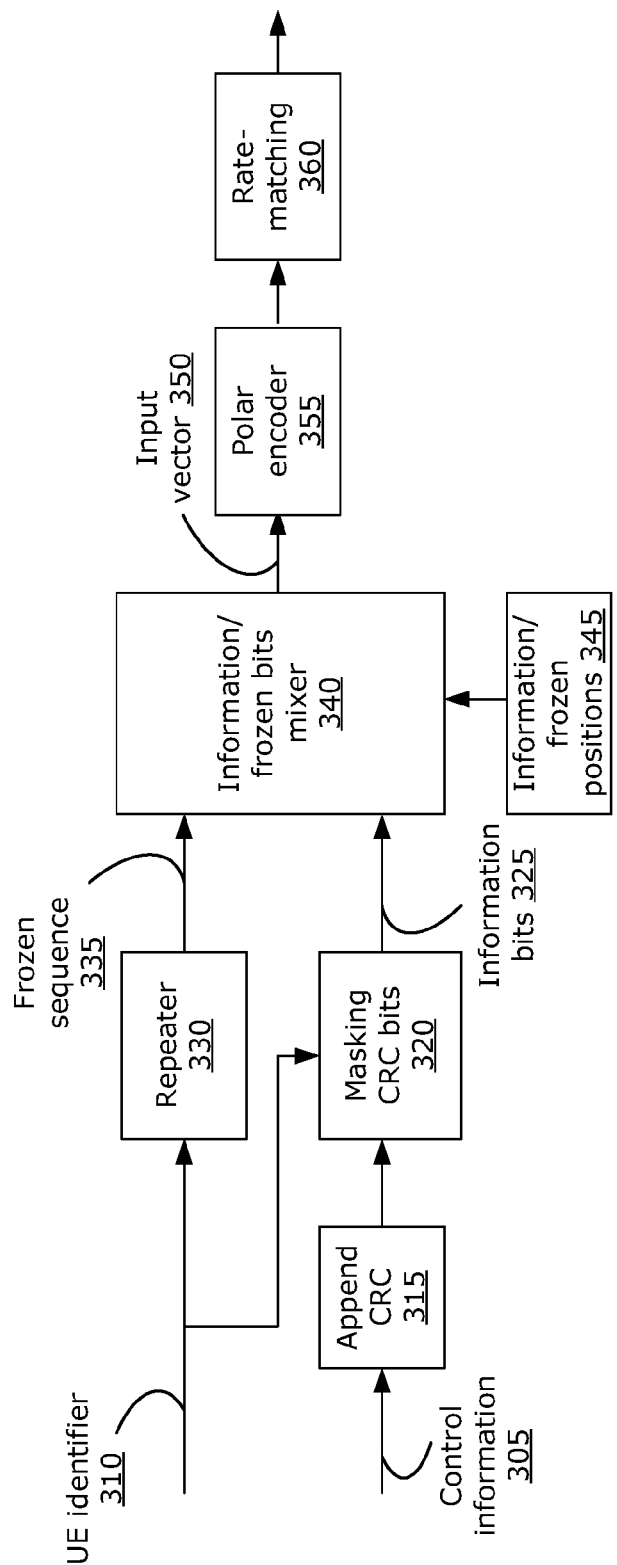
FIG. 3 is a schematic illustrating an example encoder.

FIG. 3 is a schematic diagram illustrating an example polar code encoder, which may be implemented in a BS. The encoder receives as input the actual data (e.g., control information 305 or other data for transmission) to be carried by the information bits and the UEID 310 (e.g., RNTI) to be carried by the frozen bits. At 315, an error-detection code, such as one or more CRC bits, is appended to the data for transmission. At 320, the CRC bits are masked using the UEID 310, for example by RNTI masking, resulting in the information bits 325. The UEID 310 is used to generate the frozen sequence 335. In the example shown, the UEID 310 is repeated by a repeater 330 to generate the frozen sequence 335, however in some examples, the repeater 330 may not be used. Generally, repetition of the UEID 310 in the frozen sequence 335 may help to increase the differences between frozen sequences 335 specific to different UEs.

The generated frozen sequence 335 and the information bits 325 are input into the information/frozen bits mixer 340, which also receives as input the predefined information/frozen positions 345. The result is the input vector 350, which is encoded by the polar encoder 355. At 360, rate-matching is performed on the encoded codeword to match the code rate of the transmission channel for the codeword. The result is provided for transmission (e.g., by a transmitter of the BS).

Thus, at the encoder, the UEID 310 is used not only to mask the error-detection code, but also to generate the frozen sequence for the frozen bits.

At the UE, a channel candidate is successfully detected and decoded as a channel intended for the UE only if the UE's UE-specific frozen sequence matches the frozen sequence encoded in the coded block, and if the UE de-masks the decoded CRC bits with the right UEID (e.g., RNTI) mask. If the UE-specific frozen sequence used by the UE does not match the frozen sequence encoded in the coded block, the path metric generated during decoding would be greater than if the UE-specific frozen sequence does match the frozen sequence encoded in the block. The decoder at the UE may perform decoding in two stages.

Figure 4:
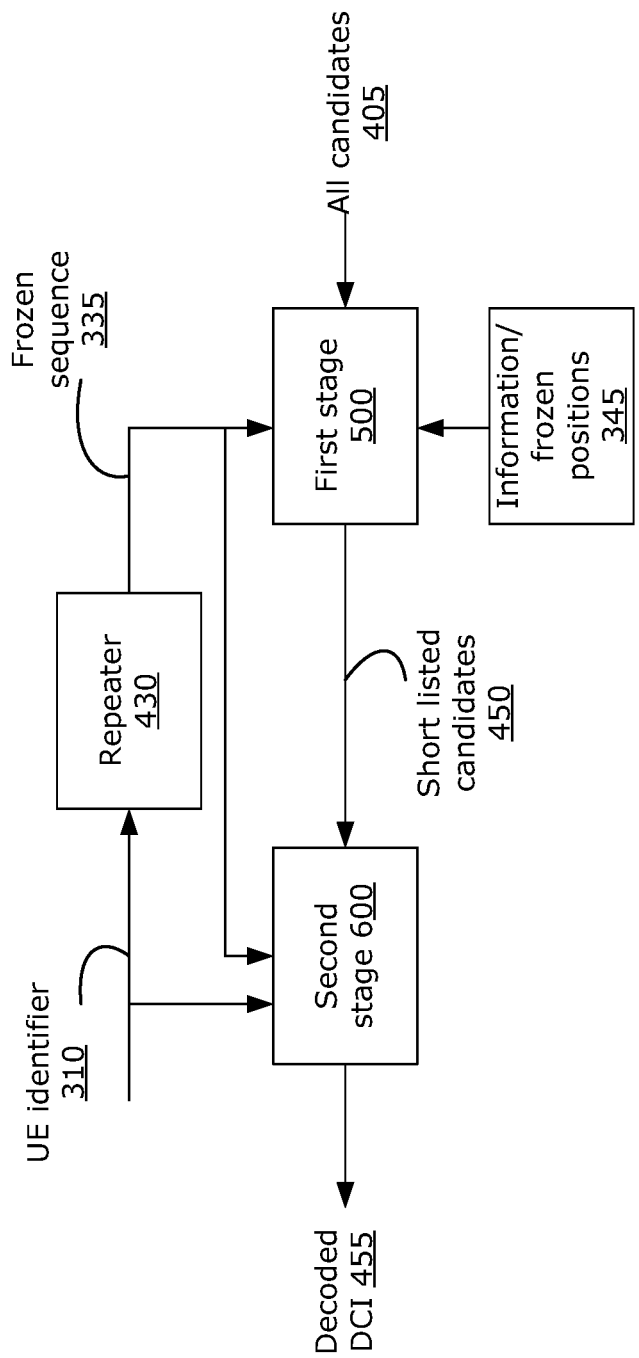
FIG. 4 is a schematic illustrating an example decoder, having first and second stages.

FIG. 4 is a schematic diagram illustrating an example polar code decoder, which may be implemented in a UE. The input into the decoder is the channel log-likelihood ratios (LLRs) generated by the UE's demodulator. All candidates 405 are processed by a first stage 500 of the decoder, described further below. At the first stage 500, the decoder receives as input the frozen sequence 335 generated by repetition of the UEID 310 using a repeater 430 (which performs the same repeating operation as the repeater 330 at the encoder). The first stage 500 also receives as input the information/frozen positions 345. As explained above, the frozen sequence 335 and the information/frozen positions 345 are known to both the encoder and the decoder. The UE-specific frozen sequence 335 may be unchanging, or may change only when the UE is assigned a new UEID, and a particular UE only needs to know its own UE-specific frozen sequence 335. Hence, although FIG. 4 shows the frozen sequence 335 being generated using the repeater 430, in some examples instead of generating the frozen sequence 335 from the UEID 310, the frozen sequence 335 may already be stored in the UE memory and retrieved for use as needed.

The first stage 500 of the decoder uses the UE-specific frozen sequence 335 to identify one or more short listed candidates 450 to be decoded by a second stage 600, described further below. The UE-specific frozen sequence 335 and the UEID 310 are used by the second stage 600 of the decoder. From the second stage 600, the output is the detected PDCCH and decoded DCI 455 (in examples where the implementation is for detection of a control channel). In some instances, the result from the first stage 500 may be that there are no short listed candidates 450 for further processing, and the second stage 600 of decoding need not be carried out. In some instances, the result from the second stage 600 may be that there is no detected PDCCH and no decoded DCI 455 is outputted.

Figure 5:
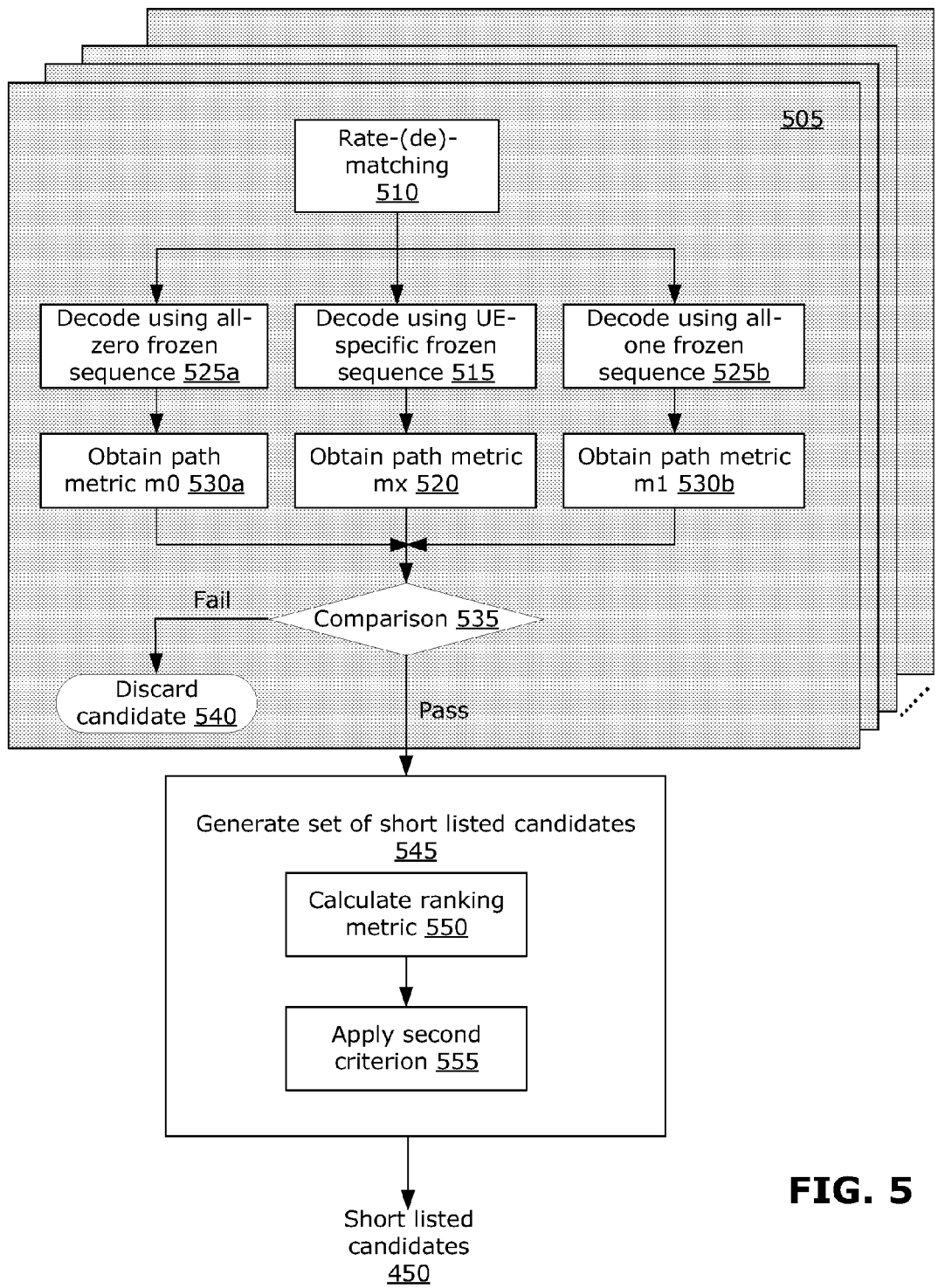
FIG. 5 is a flowchart illustrating an example method to be performed by a first stage of the decoder.

FIG. 5 is a flowchart illustrating an example method that may be carried out at the first stage 500 of the decoder. In this example, the first stage 500 makes use of an SC decoder, which does not require use of any error-detection code and is relatively simple and efficient compared to a list decoder. The use of an SC decoder enables the first stage 500 to quickly process all of the channel candidates. The first stage 500 serves to reduce the number of candidates to a short list of candidates for processing in the second stage 600. BLER performance may not be a significant concern at the first stage 500 of the decoder, because the first stage 500 is followed by the second stage 600, which is designed to have better BLER performance.

The first stage 500 performs the steps of 505 for each channel candidate (e.g., 44 PDCCH candidates). The steps of 505 are discussed below for a single channel candidate. The first stage 500 may perform these steps successively for each channel candidate. In other examples, one or more of these steps may be performed in parallel for multiple channel candidates.

At 510, rate-(de)-matching is performed on the encoded block from the channel candidate being processed. The rate-(de)-matching is dependent on the code rate of the particular channel candidate, which may be different for each candidate.

At 515, the rate-(de)-matched block is decoded, for example using an SC decoder. This first decoding uses the UE's UE-specific frozen sequence for the decoding. As discussed above, the UE-specific frozen sequence may be based on the UE's own UEID, such as the UE's RNTI.

At 520, a path metric is obtained from the decoding using the UE-specific frozen sequence. The path metric may be an indicator of whether the frozen sequence used for the decoding matches the frozen sequence encoded in the received block. The smaller the path metric value, the more likely the block's frozen sequence matches the frozen sequence used for the decoding.

Because each channel candidate may have its own code rates and lengths, the path metric obtained at 520 for each candidate may not be directly comparable. In this example, the path metric from the decoding using the UE-specific frozen sequence is instead compared with a path metric from a decoding using a reference frozen sequence.

At 525a, the rate-(de)-matched block is decoded using a first reference frozen sequence, such as an all-zero frozen sequence, for example using an SC decoder. The first reference frozen sequence may be any bit sequence that is different from the UE-specific frozen sequence for the particular UE. For example, the first reference frozen sequence may be the UE-specific frozen sequence of a different UE, or a randomly generated sequence (which the UE may check to ensure it is not identical to the UE-specific frozen sequence).

At 530a, a path metric is obtained from the decoding performed at 525a.

In some examples, such as that shown in FIG. 5, a decoding may be carried out, at 525b, using a second reference frozen sequence (e.g., an all-one frozen sequence) and another path metric is obtained at 530b.

In this example, the path metric obtained from decoding using the UE-specific frozen sequence is designated as mx, the path metric obtained from decoding using the all-zero reference frozen sequence is designated as m0, and the path metric obtained from decoding using the all-one reference frozen sequence is designated as m1.

At 535, the path metric from the decoding using the UE-specific frozen sequence is compared with the path metric(s) from the decoding using the reference frozen sequence(s). In the example of FIG. 5, mx is compared against each of m0 and m1 independently. If the block on the particular channel candidate is intended for the UE, mx should be smaller than m0 and m1. Generally, the greater the bit-wise difference between the reference frozen sequence and the UE-specific frozen sequence, the greater the difference between mx and m1 or m0. Comparison against a decoding using a single reference frozen sequence may be sufficient, however comparing against two or more decodings using different reference frozen sequences may provide greater reliability.

If the comparison at 535 satisfies a predetermined criterion, then the channel candidate is added to the set of short listed candidates 450 for further processing in the second stage 600 of the decoder. In the example of FIG. 5, the predetermined criterion is that mx is smaller than m0 and also smaller than m1. If this is not the case, then at 540 the candidate is discarded and is not further processed in the second stage 600.

At 545, a set of short listed candidates 450 is generated from those candidates that pass the comparison at 535. In some examples, the short listed candidates 450 may be generated by adding to the set each candidate that passes the comparison at 535.

In some examples, such as the example of FIG. 5, a second criterion may be optionally applied to generate the set of short listed candidates 450. This second criterion may be based on a ranking metric.

At 550, a ranking metric may be calculated for each candidate that passes the comparison at 535. For example, the ranking metric may be a normalization of the path metric mx, and this normalization may enable direct comparison of the path metrics among different candidates. An example of the ranking metric is $$m(i) = \frac{(m0_i/mx_i) + (m1_i/mx_i)}{2},$$

where i indexes the channel candidates. The ranking metric may be used to rank the candidates according to the likelihood of a successful detection.

At 555, the second criterion may be applied to the ranking metric. The second criterion may limit the short listed candidates 450 to a predetermined number T of candidates. For example, the second criterion may limit the short listed candidates 450 to three (i.e., T=3) and only the three candidates having the highest ranking metric are included in the short listed candidates 450. In another example, the second criterion may limit the short listed candidates 450 to those candidates having a ranking metric that satisfies a predetermined threshold, for example being greater than a predetermined threshold value. The predetermined number T or the predetermined threshold value may be a parameter that is selected to reduce the number of times the CRC bits will be used in the second stage 600 of the decoder.

The generated set of short listed candidates 450 is then processed by the second stage 600. In some cases, there may be no short listed candidates 450 (i.e., the generated set of short listed candidates 450 may be empty). For example, all candidates may fail to pass the comparison, or where the second criterion is used none of the candidates may satisfy the second criterion. Where there are no short listed candidates 450, the UE may return to continue monitoring for channel candidates.

Figure 6:
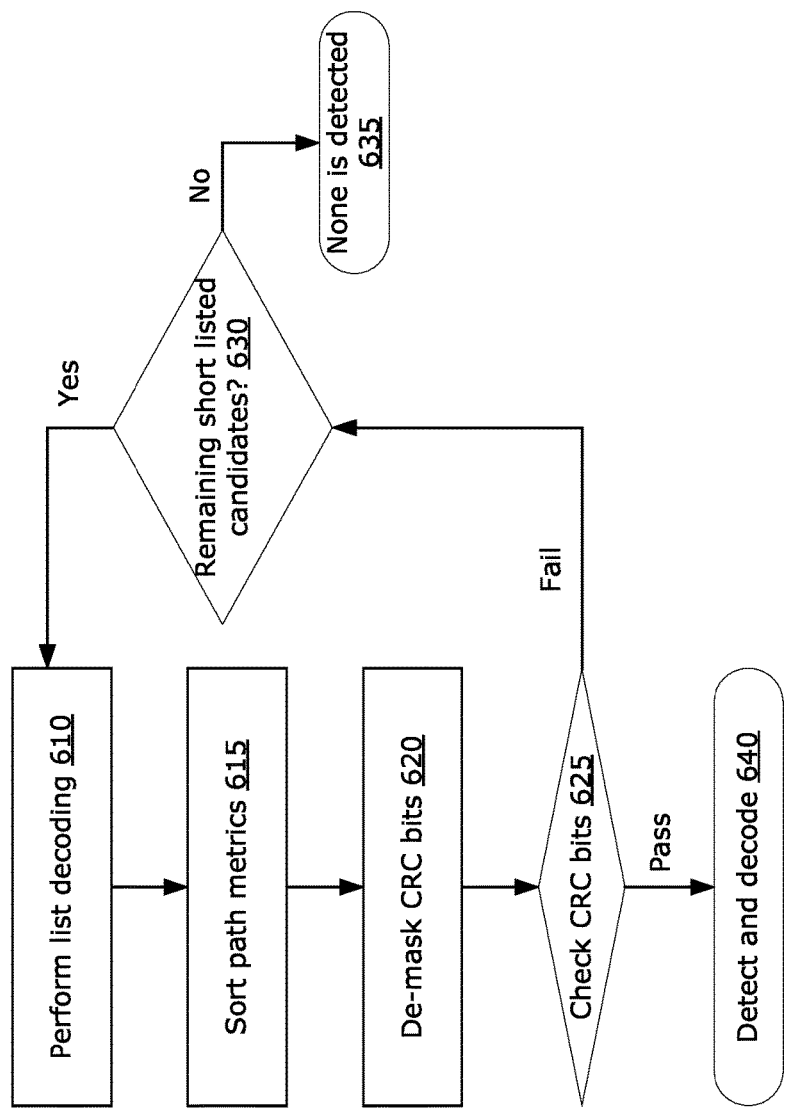
FIG. 6 is a flowchart illustrating an example method to be performed by a second stage of the decoder.

FIG. 6 is a flowchart illustrating an example method that may be performed by the second stage 600 of the decoder. In this example, the second stage 600 makes use of CA list decoding, which has higher BLER performance than SC decoder. The second stage 600 processes those candidates in the short list of candidates generated by the first stage 500 of the decoder. Because the second stage 600 processes only the short listed candidates 450, rather than all channel candidates, the number of times the CRC bits are used is reduced. Parameters used in the first stage 500 as well as the second stage 600 of the decoder may be selected to control the number of times the CRC bits is used to within a desired limit, as discussed further below.

In the example of FIG. 6, the second stage 600 iteratively performs an error-detection code assisted decoding (e.g., CA list decoding) on each of the short listed candidates 450 generated by the first stage 500.

In cases where a ranking metric has been calculated (e.g., at 550 discussed above), the short listed candidates 450 may be processed in the second stage 600 in order of descending rank, based on their respective ranking metric. Processing the candidates in order based on their respective ranking metric would enable the second stage 600 of the decoder to process the most promising candidate first, potentially successfully detecting a channel earlier. Once the UE has detected a channel that is intended for itself, there is no need to further process the other candidates.

In other examples, the second stage 600 may decode multiple candidates in parallel. Although CA list decoding is described herein, other decoders may be used at the second stage 600.

At 610, list decoding is performed on the candidate, using the UE-specific frozen sequence. The list size of the list decoder may be designated as L.

At 615, the path metrics of the L paths are sorted. The most reliable F paths are kept and the others are discarded. In some examples, all L paths may be kept, in which case F=L.

At 620, the CRC bits for the remaining F paths are de-masked using the UE's RNTI.

At 625, a CRC check is performed using the de-masked CRC bits.

If the CRC fails for all F paths then the candidate is discarded. At 630, it is determined whether there are other short listed candidates 450 to be processed. If so, the next candidate is processed at 610. Where a ranking metric has been calculated, the next candidate to be processed may be the candidate with the next highest rank, based on the respective ranking metric. If no short listed candidates 450 remain to be processed, then at 635 it is determined that no channel is intended for the UE.

Returning to 625, if a path passes CRC, then at 640 it is determined that a channel (e.g., PDCCH) has been successfully detected and the information (e.g., DCI) on the detected channel is decoded.

It should be noted that the CRC bits are not used in the first stage 500 of the decoder, but only in the second stage 600 of the decoder. The number of times the CRC bits are used for checking (at 625, discussed above) may be controlled by selecting appropriate parameters in the first and second stages of the decoder. In the examples discussed above, at the first stage 500, the parameter T defines the number of candidates to be included in the set of short listed candidates 450. At the second stage 600, the parameter F defines the number of most reliable paths, from all L survivor paths obtained from the list decoding, on which CRC is performed for each candidate. Thus, the CRC bits are used a maximum of T x F times in the above examples. For T=3 and F=8, the CRC bits are used a maximum of 24 times. For T=1 and F=32, the CRC bits are used a maximum of 32 times. It is generally considered acceptable, in LTE applications, for CRC bits to be used up to 44 times while still maintaining an acceptably low $P_{FA}$ (e.g., lower than 0.001). As illustrated in the above discussion, the usage of CRC bits can be readily controlled to be less than 44 times, in accordance with examples discussed herein.

The total number of candidates to be considered may be increased to be more than 44. The first stage 500 of the decoder performs a relatively simple and quick first pass through all candidates, and the total number of candidates processed at the first stage 500 may be increased over 44 without negatively affecting the usage of the CRC bits for checking. Because the first stage 500 is used to generate a short list of candidates to be processed at the second stage 600, a CA list polar decoder can be used at the second stage 600, regardless of the total number of initial candidates. As well, the decoding performed at the second stage 600 may be similar to current decoding architecture, thus requiring at most minor changes to the decoding architecture.

Figure 7:
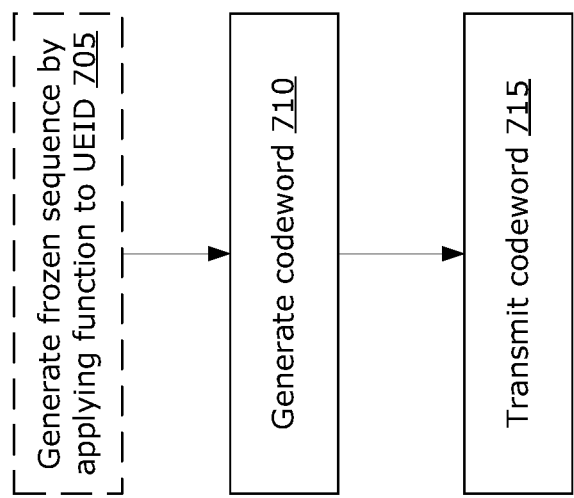
FIG. 7 is a flowchart illustrating an example method for encoding.

FIG. 7 is a flowchart illustrating an example method for encoding. For example, the method illustrated in FIG. 7 may be performed by transmitter having a polar encoder, such as the encoder of FIG. 3.

Optionally, at 705, a UE-specific frozen sequence may be generated by applying a function to the UEID of a recipient UE. Any suitable function may be applied, such as a repeater function as described above.

At 710, a codeword is generated for the recipient UE, using the encoder. The input vector to the encoder includes the UE-specific frozen sequence (e.g., optionally generated at 705 above) in frozen bit positions. The input vector further includes data for transmission in information bit positions. The UE-specific frozen sequence is associated with the recipient UE, for example the UE-specific frozen sequence may be based on the UEID of the recipient UE, as described above.

The UEID may be a RNTI or a group identifier, for example. In some examples, the data transmitted in the information bit positions may include control information.

In some examples, the method may include appending an error-detection code (e.g., one or more CRC bits) to the data to be transmitted, and the CRC bits may be masked using the UEID (e.g., by RNTI masking) to result in the information bits that are to be transmitted in information bit positions.

At 715, the codeword is transmitted. In some examples, transmitting the codeword may include performing rate-matching on the codeword to match the code rate of the transmission channel for the codeword.

Figure 8:
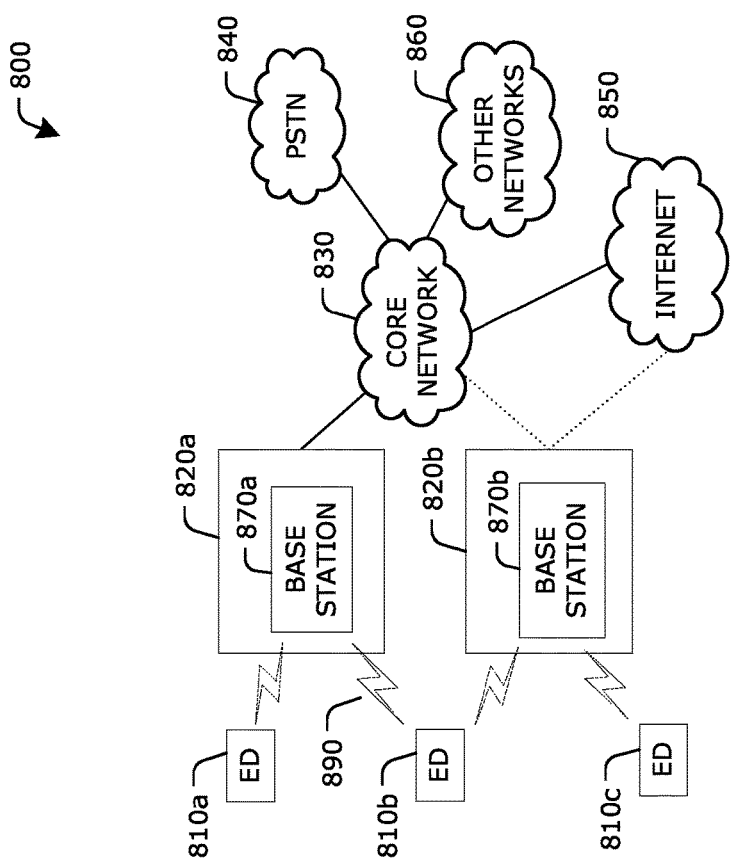
FIG. 8 is a block diagram of an example communication system in which embodiments disclosed herein may be used.

FIG. 8 illustrates an example communication system 800 in which embodiments of the present disclosure could be implemented. In general, the communication system 100 enables multiple wireless or wired elements to communicate data and other content. The purpose of the communication system 800 may be to provide content (voice, data, video, text) via broadcast, narrowcast, user device to user device, etc. The communication system 800 may operate by sharing resources such as bandwidth.

In this example, the communication system 800 includes electronic devices (ED) 810a-810c, radio access networks (RANs) 820a-820b, a core network 830, a public switched telephone network (PSTN) 840, the internet 850, and other networks 860. Although certain numbers of these components or elements are shown in FIG. 8, any reasonable number of these components or elements may be included.

The EDs 810a-810c and base stations 870a-870b are examples of communication equipment that can be configured to implement some or all of the functionality and/or embodiments described herein. For example, any one of the EDs 810a-810c and base stations 870a-870b could be configured to implement the encoding or decoding functionality (or both) described above, for example any one or combination of the methods illustrated in FIGS. 5-7. In another example, any one of the EDs 810a-810c and base stations 870a-870b could include the encoder or decoder (or both) described above with reference to FIGS. 3 and 4.

The EDs 810a-810c are configured to operate, communicate, or both, in the communication system 800. For example, the EDs 810a-810c are configured to transmit, receive, or both via wireless or wired communication channels. Each ED 810a-810c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 8, the RANs 820a-820b include base stations 870a-870b, respectively. Each base station 870a-870b is configured to wirelessly interface with one or more of the EDs 810a-810c to enable access to any other base station 870a-870b, the core network 830, the PSTN 840, the Internet 850, and/or the other networks 860. For example, the base stations 870a-870b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router.

Any ED 810a-810c may be alternatively or additionally configured to interface, access, or communicate with any other base station 870a-870b, the internet 850, the core network 830, the PSTN 840, the other networks 860, or any combination of the preceding. The communication system 800 may include RANs, such as RAN 820b, wherein the corresponding base station 870b accesses the core network 830 via the internet 850, as shown.

The EDs 810a-810c and base stations 870a-870b are examples of communication equipment that can be configured to implement some or all of the functionality and/or embodiments described herein. In the embodiment shown in FIG. 8, the base station 870a forms part of the RAN 820a, which may include other base stations, base station controller(s) (BSC), radio network controller(s) (RNC), relay nodes, elements, and/or devices. Any base station 870a, 870b may be a single element, as shown, or multiple elements, distributed in the corresponding RAN, or otherwise. Also, the base station 870b forms part of the RAN 820b, which may include other base stations, elements, and/or devices. Each base station 870a-870b transmits and/or receives wireless signals within a particular geographic region or area, sometimes referred to as a "cell" Or "coverage area". A cell may be further divided into cell sectors, and a base station 870a-870b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 820a-820b shown is exemplary only. Any number of RAN may be contemplated when devising the communication system 800.

The base stations 870a-870b communicate with one or more of the EDs 810a-810c over one or more air interfaces 890 using wireless communication links e.g. radio frequence (RF), microwave, infrared (IR), etc. The air interfaces 890 may utilize any suitable radio access technology. For example, the communication system 800 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 890.

A base station 870a-870b may implement Universal Mobile Telecommunication System (UMTS) Terrestrial Radio Access (UTRA) to establish an air interface 890 using wideband CDMA (WCDMA). In doing so, the base station 870a-870b may implement protocols such as HSPA, HSPA+ optionally including HSDPA, HSUPA or both. Alternatively, a base station 870a-870b may establish an air interface 890 with Evolved UTMS Terrestrial Radio Access (E-UTRA) using LTE, LTE-A, and/or LTE-B. It is contemplated that the communication system 800 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 820a-820b are in communication with the core network 830 to provide the EDs 810a-810c with various services such as voice, data, and other services. The RANs 820a-820b and/or the core network 830 may be in direct or indirect communication with one or more other RANs (not shown), which may or may not be directly served by core network 830, and may or may not employ the same radio access technology as RAN 820a, RAN 820b or both. The core network 830 may also serve as a gateway access between (i) the RANs 820a-820b or EDs 810a-810c or both, and (ii) other networks (such as the PSTN 840, the internet 850, and the other networks 860). In addition, some or all of the EDs 810a-810c may include functionality for communicating with different wireless networks over different wireless links using different wireless technologies and/or protocols. Instead of wireless communication (or in addition thereto), the EDs 810a-810c may communicate via wired communication channels to a service provider or switch (not shown), and to the internet 850. PSTN 840 may include circuit switched telephone networks for providing plain old telephone service (POTS). Internet 850 may include a network of computers and subnets (intranets) or both, and incorporate protocols, such as IP, TCP, UDP. EDs 810a-810c may be multimode devices capable of operation according to multiple radio access technologies, and incorporate multiple transceivers necessary to support such.

Figure 9A:
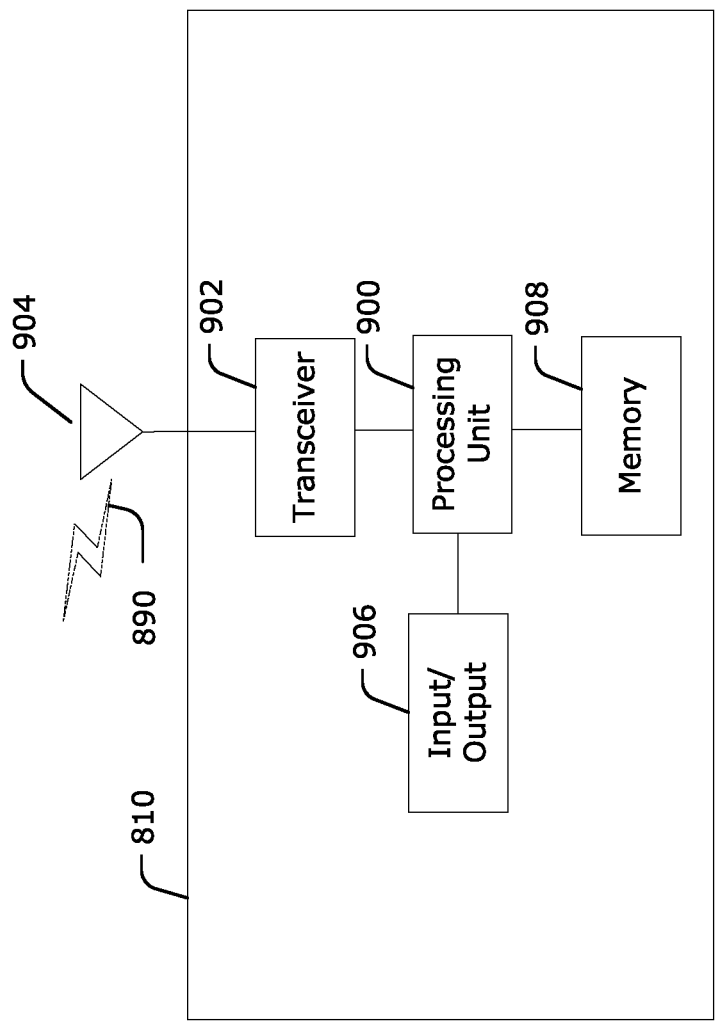
FIGS. 9A and 9B are block diagrams of an example Electronic Device (ED) and an example base station which may implement embodiments disclosed herein.
Figure 9B:
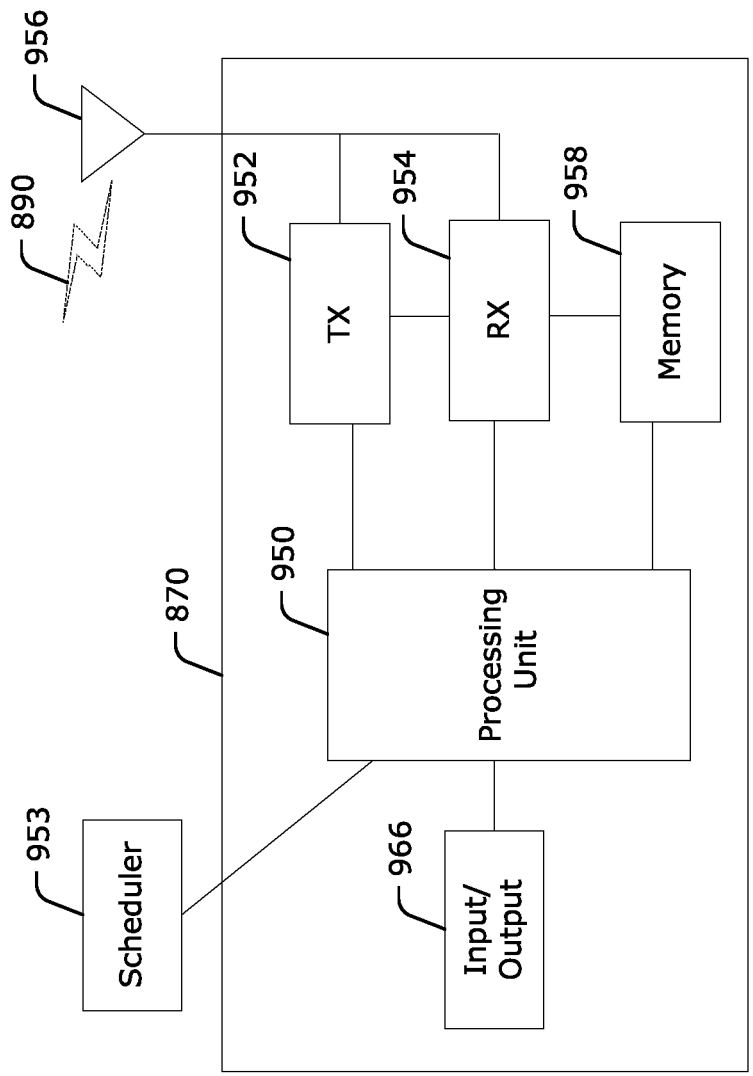

FIGS. 9A and 9B illustrate example devices that may implement the methods and teachings according to this disclosure. In particular, FIG. 9A illustrates an example ED 810, and FIG. 9B illustrates an example base station 870. These components could be used in the communication system 800 or in any other suitable system.

As shown in FIG. 9A, the ED 810 includes at least one processing unit 900. The processing unit 900 implements various processing operations of the ED 810. For example, the processing unit 900 could perform signal coding, data processing, power control, input/output processing, or any other functionality enabling the ED 810 to operate in the communication system 800. The processing unit 900 may also be configured to implement some or all of the functionality and/or embodiments described in more detail above. Each processing unit 900 includes any suitable processing or computing device configured to perform one or more operations. Each processing unit 900 could, for example, include a microprocessor, microcontroller, digital signal processor, field programmable gate array, or application specific integrated circuit.

The ED 810 also includes at least one transceiver 902. The transceiver 902 is configured to modulate data or other content for transmission by at least one antenna or Network Interface Controller (NIC) 904. The transceiver 902 is also configured to demodulate data or other content received by the at least one antenna 904. Each transceiver 902 includes any suitable structure for generating signals for wireless or wired transmission and/or processing signals received wirelessly or by wire. Each antenna 904 includes any suitable structure for transmitting and/or receiving wireless or wired signals. One or multiple transceivers 902 could be used in the ED 810, and one or multiple antennas 904 could be used in the ED 810. Although shown as a single functional unit, a transceiver 902 could also be implemented using at least one transmitter and at least one separate receiver.

The ED 810 further includes one or more input/output devices 906 or interfaces (such as a wired interface to the internet 850). The input/output devices 906 permit interaction with a user or other devices in the network. Each input/output device 906 includes any suitable structure for providing information to or receiving information from a user, such as a speaker, microphone, keypad, keyboard, display, or touch screen, including network interface communications.

In addition, the ED 810 includes at least one memory 908. The memory 908 stores instructions and data used, generated, or collected by the ED 810. For example, the memory 908 could store software instructions or modules configured to implement some or all of the functionality and/or embodiments described above and that are executed by the processing unit(s) 900. Each memory 908 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 9B, the base station 870 includes at least one processing unit 950, at least one transmitter 952, at least one receiver 954, one or more antennas 956, at least one memory 958, and one or more input/output devices or interfaces 966. A transceiver, not shown, may be used instead of the transmitter 952 and receiver 954. A scheduler 953 may be coupled to the processing unit 950. The scheduler 953 may be included within or operated separately from the base station 870. The processing unit 950 implements various processing operations of the base station 870, such as signal coding, data processing, power control, input/output processing, or any other functionality. The processing unit 950 can also be configured to implement some or all of the functionality and/or embodiments described in more detail above. Each processing unit 950 includes any suitable processing or computing device configured to perform one or more operations. Each processing unit 950 could, for example, include a microprocessor, microcontroller, digital signal processor, field programmable gate array, or application specific integrated circuit.

Each transmitter 952 includes any suitable structure for generating signals for wireless or wired transmission to one or more EDs or other devices. Each receiver 954 includes any suitable structure for processing signals received wirelessly or by wire from one or more EDs or other devices. Although shown as separate components, at least one transmitter 952 and at least one receiver 954 could be combined into a transceiver. Each antenna 956 includes any suitable structure for transmitting and/or receiving wireless or wired signals. Although a common antenna 956 is shown here as being coupled to both the transmitter 952 and the receiver 954, one or more antennas 956 could be coupled to the transmitter(s) 952, and one or more separate antennas 956 could be coupled to the receiver(s) 954. Each memory 958 includes any suitable volatile and/or non-volatile storage and retrieval device(s) such as those described above in connection to the ED 810. The memory 958 stores instructions and data used, generated, or collected by the base station 870. For example, the memory 958 could store software instructions or modules configured to implement some or all of the functionality and/or embodiments described above and that are executed by the processing unit(s) 950.

Each input/output device 966 permits interaction with a user or other devices in the network. Each input/output device 966 includes any suitable structure for providing information to or receiving/providing information from a user, including network interface communications.

The present disclosure provides examples in the context of blind detection of a control channel. However, the present disclosure may be applicable to other situations where blind detection is used. For example, the transmitted data encoded in the encoded block may be any information that is to be transmitted to the UE.

The examples described herein use a UE-specific frozen sequence that is based on a UEID. However, the UE-specific frozen sequence may be any bit sequence that is uniquely UE-specific and is known to both the encoder and decoder. For example, the BS may assign a unique UE-specific frozen sequence to each associated UE, for example at the time of initial association. Where the UE-specific frozen sequence is not based on a UEID, the UE-specific frozen sequence may be stored in the respective memories of the BS and each UE, and retrieved for use as required.

As discussed above, in some examples, the UEID is used to generate a UE-specific frozen sequence based on repetition of the UEID. For example, if there are more frozen bit positions than the bit-length of the UEID (e.g. for a low code rate R or a small number of information bits K), the UEID or a portion thereof may be repeated (e.g., using a repeater as described above) to fill all or a greater set of frozen bit positions for example, to help increase differences between frozen sequences specific to different UEs. Different repetition methods may be used.

Consider an example UEID with bits $[u_0, u_1 \ldots u_k]$ with a bit-length shorter than the total number of available frozen bit positions. In some examples, the UEID (or a portion thereof) may be repeated using block repetition, e.g., $[u_0, u_1 \ldots u_k, u_0, u_1 \ldots u_k, u_0 \ldots]$ until all of the desired number of available frozen bit positions have been filled. In some examples, the UEID may be repeated using (bit) interleaved repetition, e.g., $[u_0, u_0 \ldots u_0, u_1, u_1, u_1 \ldots u_1, \ldots u_k, \ldots u_k]$ until all or the desired number of available frozen bit positions have been filled. Other possibilities exist for repeating the UEID.

In some examples, the UEID may be used to generate the UE-specific frozen sequence by applying a function to the UEID. Thus, the UEID that is masked on the CRC bits may be different from the UE-specific frozen sequence that is placed on the frozen bits. An example of a function used to generate the UE-specific frozen sequence is the repetition of the UEID, as discussed above. In some examples, a function may be used to generate a pseudo-random binary sequence (PRBS) based on the UEID. The PRBS may be a binary sequence specific to the particular UEID used. The use of a function to generate the UE-specific frozen sequence from the UEID may result in a UE-specific frozen sequence that is longer than the bit-length of the UEID itself (e.g., where the function is a repeater). The use of a longer UE-specific frozen sequence may help to increase the coding difference between frozen sequences specific to different UEs.

In some examples, the frozen bit positions may not all be filled using the UE-specific frozen sequence—that is, the bit-length of the UE-specific frozen sequence may be smaller than the number of available frozen bit positions. The UE-specific frozen sequence may be placed on a selected subset of the available frozen bit positions, which may be selected in various ways. For example, the selected subset of frozen bit positions may be selected to include only frozen bit positions that occur after the first information bit positions, such that no portion of the UE-specific frozen sequence may be placed prior to the first information bit, enabling the decoder to skip over processing of the frozen bits prior to the first information bit. This may allow the decoder to save on average decoding energy and result in higher decoding energy gain. In some examples, the selected subset may also be selected based on reliability of the frozen bit positions. For example, the frozen bit positions having the highest reliability (e.g., based on the reliability sequence) may be selected for placing the UE-specific frozen sequence, which may help to improve the false-alarm rate in the decoder. In some examples, the selected subset may also be selected based on hamming distance. For examples, the frozen bit positions having the smallest hamming distance (e.g., the rows having the lowest row weights ($d_{min}$) in the polar generator matrix) may be selected for placing the UE-specific frozen sequence.

In an example 1, there is provided a method for encoding, the method comprising: generating a codeword intended for a recipient user equipment (UE) using an encoder for a polar code, an input vector to the encoder including a UE-specific frozen sequence in frozen bit positions and further including data for transmission in information bit positions, the UE-specific frozen sequence being associated with the recipient UE; and transmitting the codeword.

In an example 2, there is provided the method of example 1, wherein the UE-specific frozen sequence is based on a UE identifier (UEID) of the recipient UE.

In an example 3, there is provided the method of example 2, further comprising generating the UE-specific frozen sequence by repeating the UEID.

In an example 4, there is provided the method of example 2, wherein the UEID is a radio network temporary identifier (RNTI) or a group identifier.

In an example 5, there is provided the method of example 1, wherein the data for transmission comprises control information.

In an example 6, there is provided the method of example 1, wherein the input vector further includes an error-detection code appended to the data for transmission, the error-detection code being masked using a UEID.

In an example 7, there is provided a method for blind detection, the method comprising: scanning a plurality of channel candidates; generating a set of short listed channel candidates by: for each channel candidate: performing a first decoding of the channel candidate using a user equipment (UE)-specific frozen sequence; and discarding any channel candidate for which the first decoding fails to satisfy a first criterion.

In an example 8, there is provided the method of example 7, further comprising: for each short listed channel candidate, performing an error-detection code-assisted decoding of the short listed channel candidate; and for a given short listed channel candidate that passes error checking during the error-detection code-assisted decoding, decoding transmitted data from the given short listed channel candidate.

In an example 9, there is provided the method of example 7, wherein the UE-specific frozen sequence is based on a UE identifier (UEID).

In an example 10, there is provided the method of example 9, wherein the UE-specific frozen sequence comprises a repetition of the UEID.

In an example 11, there is provided the method of example 9, wherein the UEID is a radio network temporary identifier (RNTI) or a group identifier.

In an example 12, there is provided the method of example 7, wherein generating the set of short listed candidates further comprises, for each channel candidate: performing a second decoding of the channel candidate using a reference frozen sequence; and determining whether the first decoding satisfies the first criterion by comparing the first and second decoding.

In an example 13, there is provided the method of example 12, wherein the comparing comprises calculating a first path metric for the first decoding and a second path metric for the second decoding, and comparing the first and second path metrics.

In an example 14, there is provided the method of example 13, wherein the first criterion comprises the first path metric being smaller than the second path metric.

In an example 15, there is provided the method of example 7, wherein generating the set of short listed candidates further comprises: calculating a ranking metric for the channel candidate; and including or excluding the channel candidate in the set of short listed candidates based on the ranking metric.

In an example 16, there is provided the method of example 15, wherein the ranking metric is a normalization of a path metric obtained from the first decoding.

In an example 17, there is provided the method of example 7, wherein the first decoding is performed using decoding without using an error-detection code.

In an example 18, there is provided a polar encoder comprising a processor configured to cause the encoder to: generate a codeword intended for a recipient user equipment (UE) using polar code encoding, an input vector to the polar code encoding including a UE-specific frozen sequence in frozen bit positions and further including data for transmission in information bit positions, the UE-specific frozen sequence being associated with the recipient UE; and provide the codeword for transmission.

In an example 19, there is provided the polar encoder of example 18, wherein the UE-specific frozen sequence is based on a UE identifier (UEID) of the recipient UE.

In an example 20, there is provided the polar encoder of example 19, wherein the processor is further configured to cause the encoder to generate the UE-specific frozen sequence by repeating the UEID.

In an example 21, there is provided the polar encoder of example 19, wherein the UEID is a radio network temporary identifier (RNTI) or a group identifier.

In an example 22, there is provided the polar encoder of example 18, wherein the data for transmission comprises control information.

In an example 23, there is provided the polar encoder of example 18, wherein the input vector further includes an error-detection code appended to the data for transmission, the error-detection code being masked using a UEID.

In an example 24, there is provided a polar decoder comprising a processor configured to cause the decoder to: scan a plurality of channel candidates; generate a set of short listed channel candidates by: for each channel candidate: performing a first decoding of the channel candidate using a user equipment (UE)-specific frozen sequence; and discarding any channel candidate for which the first decoding fails to satisfy a first criterion.

In an example 25, there is provided the polar encoder of example 24, wherein the processor is further configured to cause the decoder to: for each short listed channel candidate, perform an error-detection code-assisted decoding of the short listed channel candidate; and for a given short listed channel candidate that passes error checking during the error-detection code-assisted decoding, decode transmitted data from the given short listed channel candidate.

In an example 26, there is provided the polar encoder of example 24, wherein the UE-specific frozen sequence is based on a UE identifier (UEID)

In an example 27, there is provided the polar encoder of example 26, wherein the UE-specific frozen sequence comprises a repetition of the UEID.

In an example 28, there is provided the polar encoder of example 26, wherein the UEID is a radio network temporary identifier (RNTI) or a group identifier.

In an example 29, there is provided the polar encoder of example 24, wherein the processor is further configured to cause the decoder to generate the set of short listed candidates by: for each channel candidate: performing a second decoding of the channel candidate using a reference frozen sequence; and determining whether the first decoding satisfies the first criterion by comparing the first and second decoding.

In an example 30, there is provided the polar encoder of example 29, wherein the processor is further configured to cause the decoder to perform the comparing by calculating a first path metric for the first decoding and a second path metric for the second decoding, and comparing the first and second path metrics.

In an example 31, there is provided the polar encoder of example 30, wherein the first criterion comprises the first path metric being smaller than the second path metric.

In an example 32, there is provided the polar encoder of example 24, wherein the processor is further configured to cause the decoder to generate the set of short listed candidates by further: calculating a ranking metric for the channel candidate; and including or excluding the channel candidate in the set of short listed candidates based on the ranking metric.

In an example 33, there is provided the polar encoder of example 32, wherein the ranking metric is a normalization of a path metric obtained from the first decoding.

In an example 34, there is provided the polar encoder of example 24, wherein the first decoding is performed using decoding without using an error-detection code.

Although the present disclosure may describe methods and processes with steps in a certain order, one or more steps of the methods and processes may be omitted or altered as appropriate. One or more steps may take place in an order other than that in which they are described, as appropriate.

Although the present disclosure may be described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A method for encoding, the method comprising:
generating a codeword intended for a recipient user equipment (UE) using an encoder for a polar code, an input vector to the encoder including a UE-specific frozen sequence in a selected subset of frozen bit positions and further including data for transmission in information bit positions, the UE-specific frozen sequence being associated with the recipient UE;
wherein the selected subset of frozen bit positions is selected from frozen bit positions that occur after a first information bit position; and
transmitting the codeword.

2. The method of claim 1, wherein the UE-specific frozen sequence is based on a UE identifier (UEID) of the recipient UE.

3. The method of claim 2, further comprising generating the UE-specific frozen sequence by applying a function to the UEID.

4. The method of claim 3, wherein the function is a repeater function applied to the UEID.

5. The method of claim 4, wherein the repeater function is applied to the UEID to generate the UE-specific frozen sequence that is at least as long as the number of frozen bit positions in the selected subset of frozen bit positions.

6. The method of claim 2, wherein the UEID is a radio network temporary identifier (RNTI) or a group identifier.

7. The method of claim 1, wherein the data for transmission comprises control information.

8. The method of claim 1, wherein the input vector further includes an error-detection code appended to the data for transmission, the error-detection code being masked using a UEID.

9. The method of claim 1, wherein the selected subset of frozen bit positions comprises frozen bit positions having highest reliability among the frozen bit positions that occur after the first information bit position.

10. The method of claim 1, wherein the selected subset of frozen bit positions comprises frozen bit positions having a smallest hamming distance among the frozen bit positions that occur after the first information bit position.

11. A polar encoder comprising a processor configured to cause the encoder to:
generate a codeword intended for a recipient user equipment (UE) using polar code encoding, an input vector to the polar code encoding including a UE-specific frozen sequence in a selected subset of frozen bit positions and further including data for transmission in information bit positions, the UE-specific frozen sequence being associated with the recipient UE;
wherein the selected subset of frozen bit positions is selected from frozen bit positions that occur after a first information bit position; and
provide the codeword for transmission.

12. The polar encoder of claim 11, wherein the UE-specific frozen sequence is based on a UE identifier (UEID) of the recipient UE.

13. The polar encoder of claim 12, wherein the processor is further configured to cause the encoder to generate the UE-specific frozen sequence by applying a function to the UEID.

14. The polar encoder of claim 13, wherein the function is a repeater function applied to the UEID.

15. The polar encoder of claim 12, wherein the UEID is a radio network temporary identifier (RNTI) or a group identifier.

16. The polar encoder of claim 11, wherein the data for transmission comprises control information.

17. The polar encoder of claim 11, wherein the input vector further includes an error-detection code appended to the data for transmission, the error-detection code being masked using a UEID.

* * * * *